United States Patent [19]

Akiyama

[11] Patent Number: 5,160,985
[45] Date of Patent: Nov. 3, 1992

[54] INSULATED GATE BIPOLAR TRANSISTOR
[75] Inventor: Hajime Akiyama, Itami, Japan
[73] Assignee: Mitsubishi Denki Kabushiki Kaisha, Tokyo, Japan
[21] Appl. No.: 342,902
[22] Filed: Apr. 25, 1989
[30] Foreign Application Priority Data
  Jan. 6, 1989 [JP] Japan .................................. 1-1507
[51] Int. Cl.$^5$ ..................... H01L 29/10; H01L 29/78
[52] U.S. Cl. .................................... 257/145; 257/144
[58] Field of Search ................ 357/23.4, 23.1, 23.13, 357/41, 43

[56]  References Cited
U.S. PATENT DOCUMENTS 4,497,106  2/1985  Momma et al. ..................... 357/43
4,803,532  2/1989  Mihara .............................. 357/23.4

FOREIGN PATENT DOCUMENTS 63-186476  8/1988  Japan ................................. 357/23.4
63-211765  9/1988  Japan .

OTHER PUBLICATIONS

Mesotaxy: Single-crystal growth of buried CoSi$_2$ layers, Alice E. White et al AT & T Bell Laboratories, Murray Hill, N.J., Appl. Phys. Lett 50(2) Jan. 12, 1987.
Applications of Simox Technology to CMOS LSI and Radiation-Hardened Devices Nuclear Instruments and Methods in Physics Research B21 (1987) 124–128 North-Holland, Amsterdam.
TiSi$_2$ and TiN Formation by Ti–Ion Implantation and Their Application to MOS Devices, Yasuhisa Omura et al, NTT LSI Laboratories, 3-1, Morinosato Wakamiya, Atsugi-shi, 243-01, Japan.

Primary Examiner—Andrew J. James
Assistant Examiner—Hung Xuan Dang
Attorney, Agent, or Firm—Oblon, Spivak, McClelland, Maier & Neustadt

[57] ABSTRACT

An insulated gate bipolar transistor has a P-type well region which is partially formed in a surface of an N$^-$-type epitaxial layer formd on a P$^+$-type semiconductor substrate. An N$^+$-type emitter region is partially formed in a surface of the well region. A buried emitter electrode is provided in a boundary portion between the well and the emitter region. The buried emitter electrode is electrically connected with a emitter electrode formed on the emitter region through a conductor layer formed in the emitter region. Thus, a parasitic working area of a parasitic transistor formed by the epitaxial layer, well region and emitter region is extremely reduced to effectively prevent a latch-up. Further, the effective area of the emitter electrode is increased to increase current capacity.

14 Claims, 9 Drawing Sheets

INSULATED GATE BIPOLAR TRANSISTOR

BACKGROUND OF THE INVENTION

1. Field of the Invention

The present invention relates to an insulated gate bipolar transistor (hereinafter referred to as IGBT), and more particularly, it relates to prevention of a latch-up phenomenon of a parasitic thyristor and a high density integration.

2. Description of the Prior Art

Figure 1:
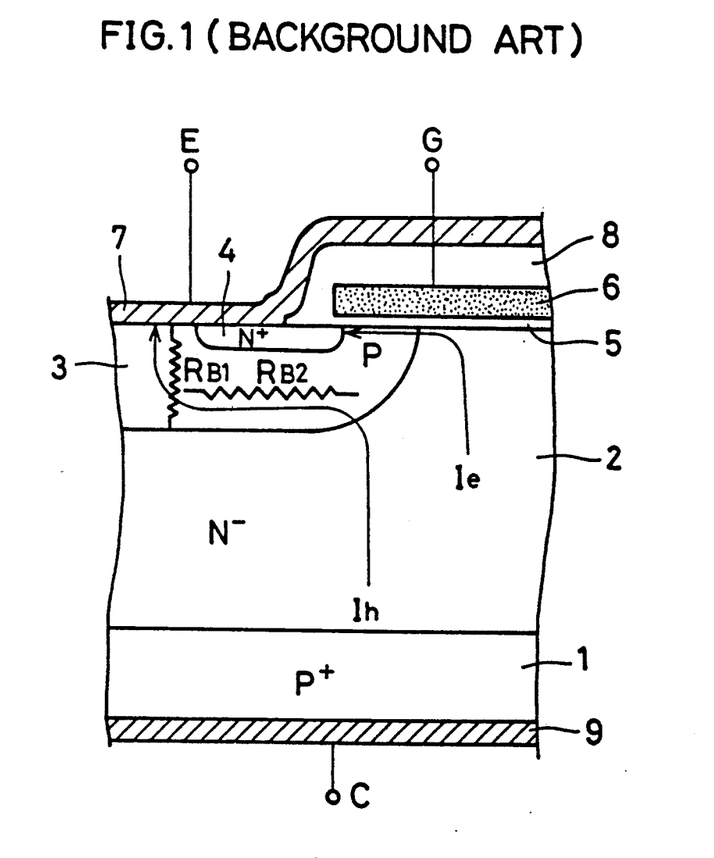
FIG. 1 is a sectional view showing a conventional n-channel IGBT.

In general, an IGBT device is formed by a number of parallel-connected IGBT elements (hereinafter referred to as IGBT cells), as shown in FIG. 1 of IEEE TRANSACTIONS ON ELECTRON DEVICES, VOL. ED-31, No.6, JUNE 1984, PP.821-828 "The Insulated Gate Transistor: A New Three-Terminal MOS-Controlled Bipolar Power Device" by B. J. Baliga et al., for example. FIG. 1 is a sectional view showing a structure of a conventional n-channel IGBT cell, and FIG. 2 is a circuit diagram showing an equivalent circuit thereof.

Referring to FIG. 1, numeral indicates a P+-type collector layer consisting of a P+-type semiconductor substrate, which has provided on one major surface of it an N⁻-type epitaxial layer 2. A P-type well region 3 is partially formed in the surface of the N⁻-type epitaxial layer 2 by selectively diffusing a P-type impurity, and an N+-type emitter region 4 is formed partially in the surface of the P-type well region 3 by selectively diffusing an N-type impurity with high concentration. A gate insulation film 5 is formed on the surface of the P-type well region 3 between the surfaces of the N⁻-type epitaxial layer 2 and of the N+-type emitter region 4. This gate insulation film 5 also covers the surface of the N⁻-type epitaxial layer 2 to be integrated with a gate insulation film of an adjacent IGBT cell. A gate electrode 6 of polysilicon, for example, is formed on the gate insulation film 5, and an emitter electrode of a metal such as aluminum is formed to be electrically connected to both the P-type well region 3 and the N+-type emitter region 4. The gate electrode 6 and the emitter electrode 7 are provided in a multilayer structure through an insulation film 8, to be commonly electrically connected to each cell forming the IGBT device. A collector metal electrode 9 is formed on the back surface of the P+-type collector layer in common with each of the IGBT cells.

An N-channel MOS structure is provided in the vicinity of the surface of the P-type well region 3 between the N⁻-type epitaxial layer 2 and the N+-type emitter region 4. A positive voltage is applied to the gate electrode 6 through a gate terminal G so that electrons flow from the N+-type emitter region 4 to the N⁻-type epitaxial layer 2 through a channel formed in the vicinity of the surface of the P-type well region 3 under the gate electrode 6. Symbol $I_e$ indicates electron current thus carried. On the other hand, positive holes, which are minority carriers are injected from the P+-type collector layer 1 into the N⁻-type epitaxial layer 2. A portion of the holes dissipate through recombination with the aforementioned electrons, while the remaining holes flow in the P-type well region 3 as hole current $I_h$. Thus, the IGBT basically operates in a bipolar manner and conductivity is increased in the N⁻-type epitaxial layer 2 due to a conductivity modulation effect, whereby a lower ON-state voltage and a larger current capacity can be implemented in contrast to a conventional power MOS.

Figure 2:
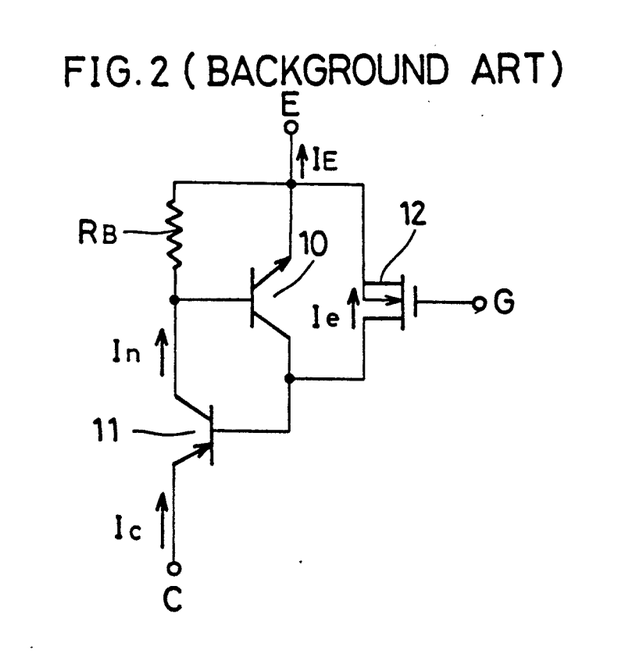
FIG. 2 is a circuit diagram showing an equivalent circuit thereof.

It is to be noted that a parasitic PNPN thyristor structure is present in the IGBT cell, as is obvious from an equivalent circuit shown in FIG. 2. Such a parasitic thyristor is formed by an NpN transistor 10 defined by the N⁻-type epitaxial layer 2, the P-type well region 3 and the N+-type emitter region 4 and a PNP transistor 11 defined by the P+-type collector layer 1, the N⁻-type epitaxial layer 2 and the P-type well region 3. When both of the transistors 10 and 11 enter their respective operating states and when the sum of current gains $\alpha_1$ and $\alpha_2$ of it becomes 1, the parasitic thyristor conducts and thereby causes a latch-up phenomenon. Since the thickness of the N⁻-type epitaxial layer 2 serving as the base of the PNP transistor 11 is much larger than the carrier diffusion length, the value $\alpha_2$ is relatively small. Further, there is a short circuit between the emitter and the base of the NPN transistor 10, so that the transistor barely enters the ON state. Therefore, no latch-up phenomenon is caused in the normal operating state, and the IGBT cell operates as a composite element of an n-channel MOSFET 12 and the PNP transistor 11. In this case, the base current of the PNP transistor 11 is controlled by the n-channel MOSFET 12 and, therefore, main current $I_C$ flowing from collector terminal C of the IGBT can be controlled by a control voltage applied to the gate terminal G. Assuming that $I_E$ represents current flowing in an emitter terminal E, the main current $I_C$ is $$I_C = I_E = I_e + I_h \tag{1}$$

When the main current $I_C$ of the IGBT is increased by some external cause such as noise applied to the gate terminal G, the electron current $I_e$ and the hole current $I_h$ are increased. If the hole current $I_h$ exceeds a certain value, the NPN transistor 10 conducts by a voltage drop caused by resistance $R_B$ of the P-type well region 3, and $\alpha_1 + \alpha_2 = 1$ is satisfied because of the increase of the current gain $\alpha_2$ of the NpN transistor 10, so that the parasitic thyristor conducts. Thus, the IGBT enters a latch-up state. The main current $I_C$ of the IGBT cannot be controlled by the control voltage applied to the gate terminal G in this state, and hence an excessive unlimited main current $I_C$ flows. In order to prevent such a latch-up phenomenon, impurity concentration of the P-type well region 3 must be increased to reduce the resistance, and the ratio of the hole current $I_h$ flowing under the N+-type emitter region 4 toward the emitter electrode 7, must be reduced.

Figure 3:
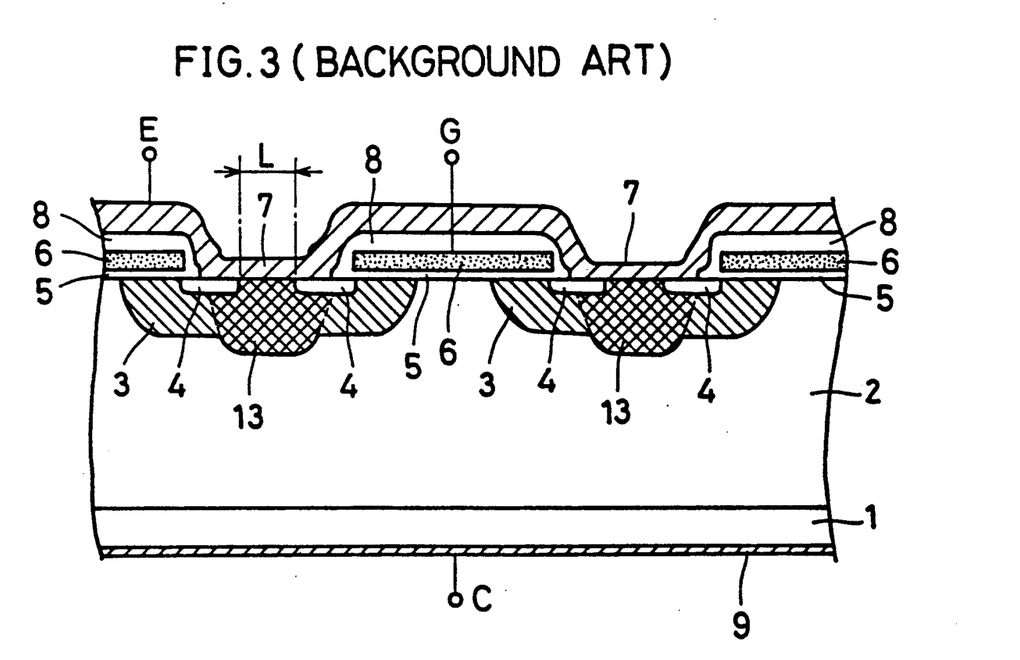
FIGS. 3 and 4 are a sectional view and a schematic perspective sectional view showing structures of conventional IGBTs for preventing a latch-up phenomenon, respectively.

FIG. 3 is a sectional view showing an example of an IGBT cell structure generally employed for preventing the latch-up phenomenon. Such a structure is shown in IEDM 83, PP.79-82, "Improved COMFETs with Fast Switching Speed and High-Current Capability" by A. M. Goodman et al., for example. Referring to FIG. 3, a P-type well region 3 of each IGBT cell, which is square when presented in a plan view is provided in its central portion with a P+-type region 13 which is formed by diffusing a P-type impurity with high concentration of the sam conductivity type as the region 3. Thus, resistance of the P-type well region 3 is reduced and hole current $I_h$ flowing in the central portion of the P-type well region 3 is relatively increased in ratio as compared with hole current $I_h$ flowing under an N+-type emitter region 4, so that an NPN transistor 10 is prevented from undergoing a transition into a conducting state.

Figure 4:
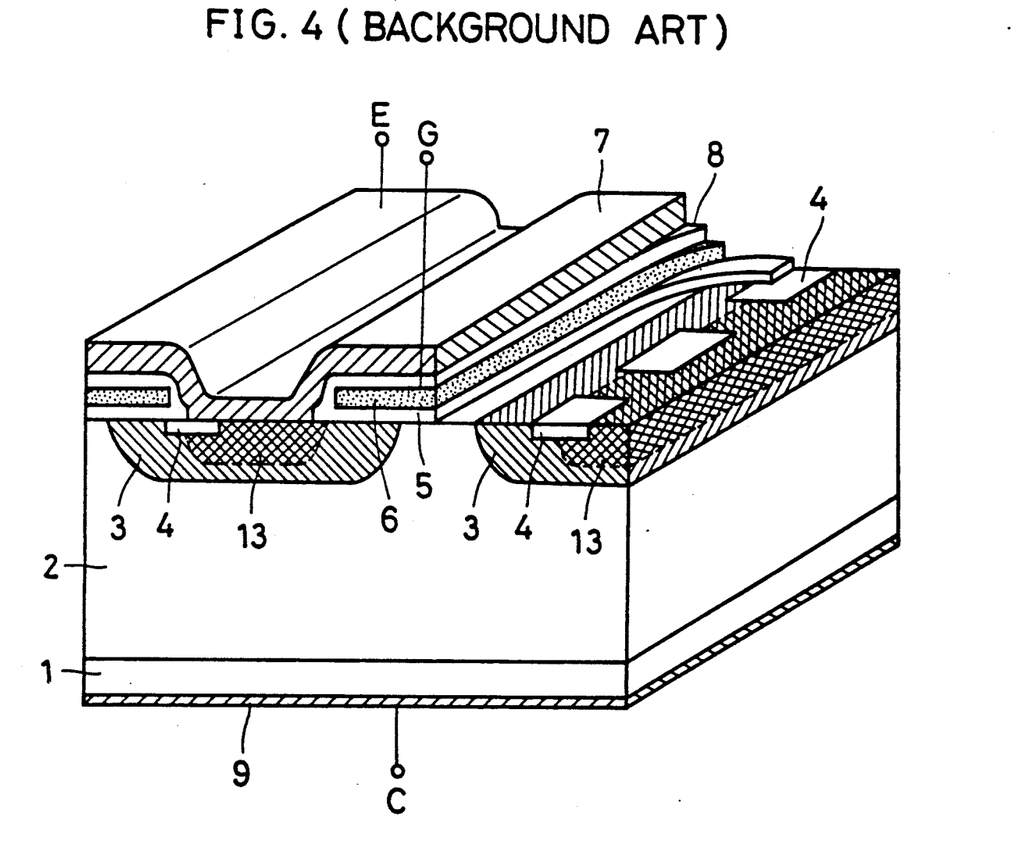

FIG. 4 is a diagrammatical perspective sectional view illustrating another example of IGBT cell structure generally employed for preventing the latch-up phenomenon. Such a structure is shown in IEDM 85, PP. 150-153 "Experimental and Numerical Study of Non-Latch-Up Bipolar-Mode MOSFET Characteristics" by A. Nakagawa et al., for example. Referring to FIG. 4, a P-type well region 3 is formed in a stripe pattern and an N+-type emitter region 4 is formed in a partially removed pattern. Thus, parts of the P-type well region 3, from which the N+-type emitter region 4 is removed, are adapted to serve as bypasses for hole current $I_h$, so that the ratio of the hole current $I_h$ flowing under the N+-type emitter region 4 is reduced. Further, a P+-type region 13 which is similar to that shown in FIG. 3, is provided.

In order to employ the structure shown in FIG. 3, the P-type well region 3 must be deeply formed, particularly in an IGBT device of high breakdown voltage, and hence the P+-type region 13 of high impurity concentration must also be formed to a deep position. Since the P+-type region 13 is formed by diffusion from the surface, concentration distribution of the impurity is inevitably lowered as the depth is increased. Therefore, resistance $R_{B1}$ in a vertical direction of the P-type well region 3 cannot be sufficiently lowered in a deep portion. Further, although the P+-type region 13 is preferably formed over the entire region under the N+-type emitter region 4, the same must not reach a channel region under the gate electrode 6, in order to avoid changing the threshold voltage of the MOSFET 12. Therefore, the P+-type region 13 must be considerably separated from the channel region in view of various errors in formation, and hence the resistance $R_{B2}$, in a direction transverse to the P-type well region 3, cannot be sufficiently lowered in a portion close to the channel. Thus, the structure shown in FIG. 3 is insufficient to cope with the latch-up phenomenon.

In the structure shown in FIG. 4, on the other hand, channels are inevitably decreased because of partial removal of the N+-type emitter region 4. Such a decrease of channels is disadvantageous for large current capacity. Further, since a top plan pattern of the IGBT cell shows an elongated rectangle, it is difficult to implement an IGBT device of high current capacity having a number of parallel-connected IGBT cells with a higher density cell arrangement when compared to those having square IGBT cells.

SUMMARY OF THE INVENTION

An insulated gate bipolar transistor according to the present invention comprises a first conductivity type first semiconductor layer having first and second major surfaces, a second conductivity type second semiconductor layer formed on the first major surface of the first semiconductor layer, a first conductivity type first semiconductor region formed in a surface of the second semiconductor layer, a second conductivity type second semiconductor region formed in a surface of the first semiconductor region, an insulation film formed on the surface of the first semiconductor region between surfaces of the second semiconductor layer and the second semiconductor region, a control electrode formed on the insulation film, a first main electrode formed on the second semiconductor region, a second main electrode formed on the second major surface of the first semiconductor layer, a buried electrode formed in a boundary portion between the first and second semiconductor regions, and a conductor layer for electrically connecting the buried electrode with the first main electrode.

According to the present invention, a buried electrode is formed in a boundary between a first conductivity type first semiconductor region and a second conductivity type second semiconductor region and the buried electrode is electrically connected with a first main electrode through a conductor layer, whereby a parasitic working area of a parasitic transistor formed by the first and second semiconductor regions and a second conductivity type second semiconductor layer is extremely reduced to effectively prevent the latch-up phenomenon, while the effective area of the first main electrode is equivalently increased to increase current capacity. The buried electrode can be easily formed by implanting metal ions to a central portion of a cell and annealing the same, for example, and hence the degree of freedom of cell design is not restricted. Thus, an insulated gate bipolar transistor can be obtained in a structure suitable for an increase in current capacity and improvement in density of cell arrangement, while effectively preventing the latch-up phenomenon Accordingly, an object of the present invention is to provide an insulated gate bipolar transistor which can effectively prevent the latch-up phenomenon and which has a structure suitable for high current capacity and implementation of cell arrangement with high density.

These and other objects, features, aspects and advantages of the present invention will become more apparent from the following detailed description of the invention when taken in conjunction with the accompanying drawings.

DETAILED DESCRIPTION OF THE PREFERRED EMBODIMENTS

Figure 5:
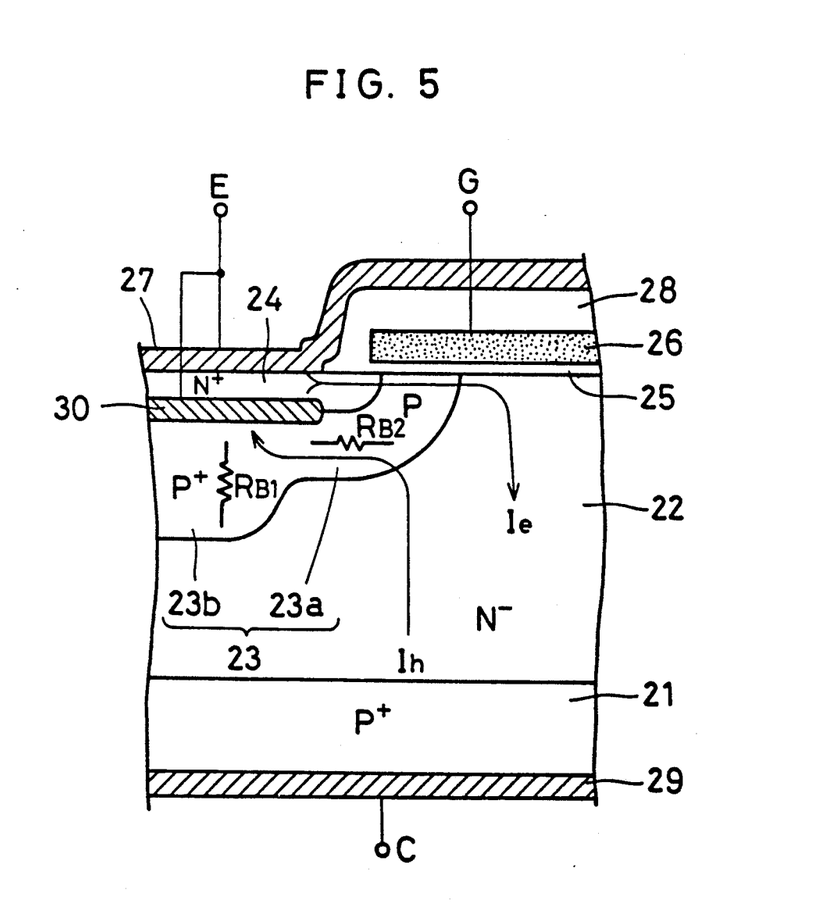
FIG. 5 is a sectional view showing an embodiment of an IGBT according to the present invention.

FIG. 5 is a sectional view showing an embodiment of an IGBT according to the present invention. Referring to FIG. 5, an N--type epitaxial layer 22 is formed on one major surface of a P+-type collector layer 21, which is formed by a P+-type semiconductor substrate. A P-type well region 23 is partially formed in the surface of the N⁻-type epitaxial layer 22 by selectively diffusing a P-type impurity. The P-type well region 23 is formed by a shallow first P-type well region 23a of a relatively low impurity concentration and a deep second P-type well region 23b of a relatively high impurity concentration provided in the central portion of the first P-type well region 23a. An N+-type emitter region 24 is partially formed in the surface of the P-type well region 23 by selectively diffusing an N-type impurity of high concentration. A buried emitter electrode 30 of Ti, Co or Mo silicide is provided in a boundary portion between the P-type well region 23 and the N+-type emitter region 24.

A gate insulating film 25 is formed on the surface of the P-type well region 23 between the surfaces of the N⁻-type epitaxial layer 22 and the N+-emitter region 24. This gate insulating film 25 also covers the surface of the N⁻-type epitaxial layer 22 to be integrated with a gate insulation film of an adjacent IGBT cell. A gate electrode 26 of polysilicon, for example, is formed on the gate insulating film 25, and an emitter electrode 27 of a metal such as aluminum is formed to be electrically connected with the N+-type emitter region 24. The emitter electrode 27 is electrically connected with a buried emitter electrode 30 through a conductor layer, as hereinafter described. The gate electrode 26 and the emitter electrode 27 are provided in a multilayer structure through an insulating film 28, to be commonly electrically connected to each cell forming the IGBT device. A collector electrode 29 of a metal is formed on the other major surface of the P+-type collector layer 21 in common with each of the IGBT cells.

Figure 6A:
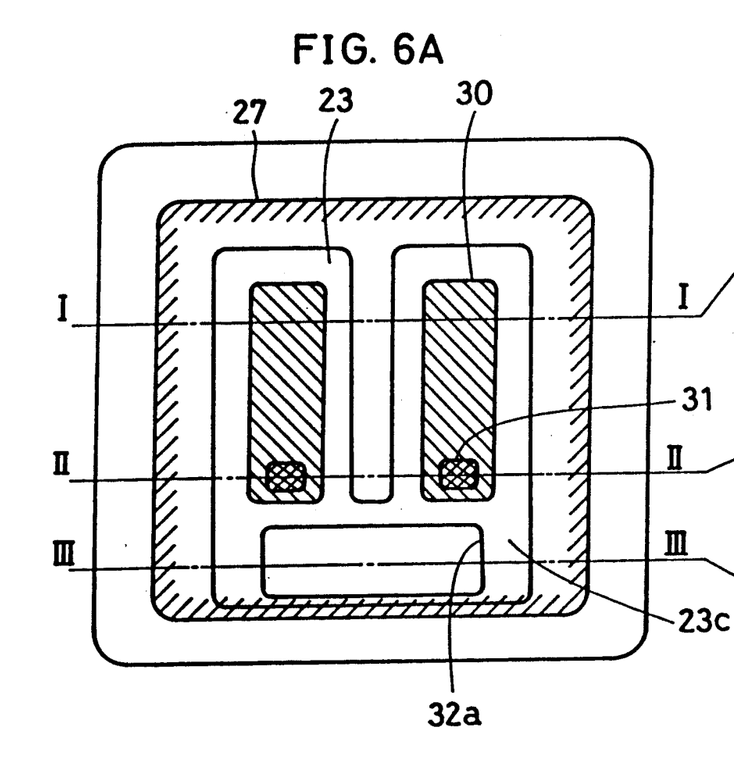
FIG. 6A is a plan view showing stripe cell arrangement.
Figure 6B:
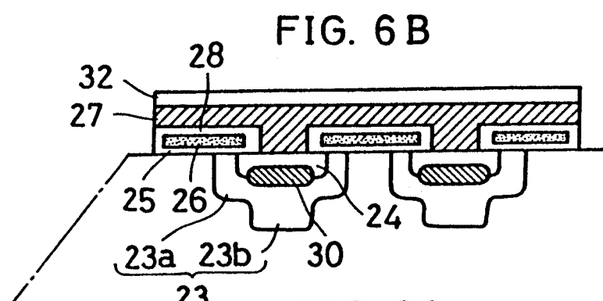
FIGS. 6B, 6C and 6D are sectional views taken along the lines I—I, II—II and III—III in FIG. 6A, respectively.
Figure 6C:
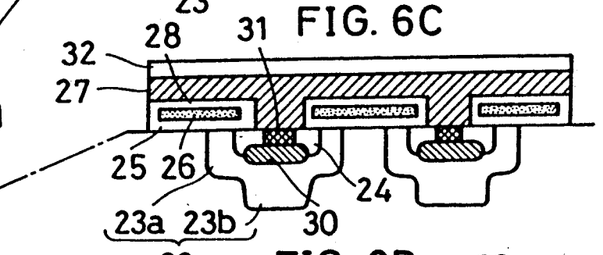
Figure 6D:
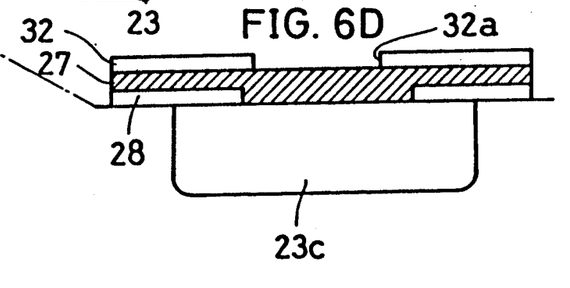
Figure 7A:
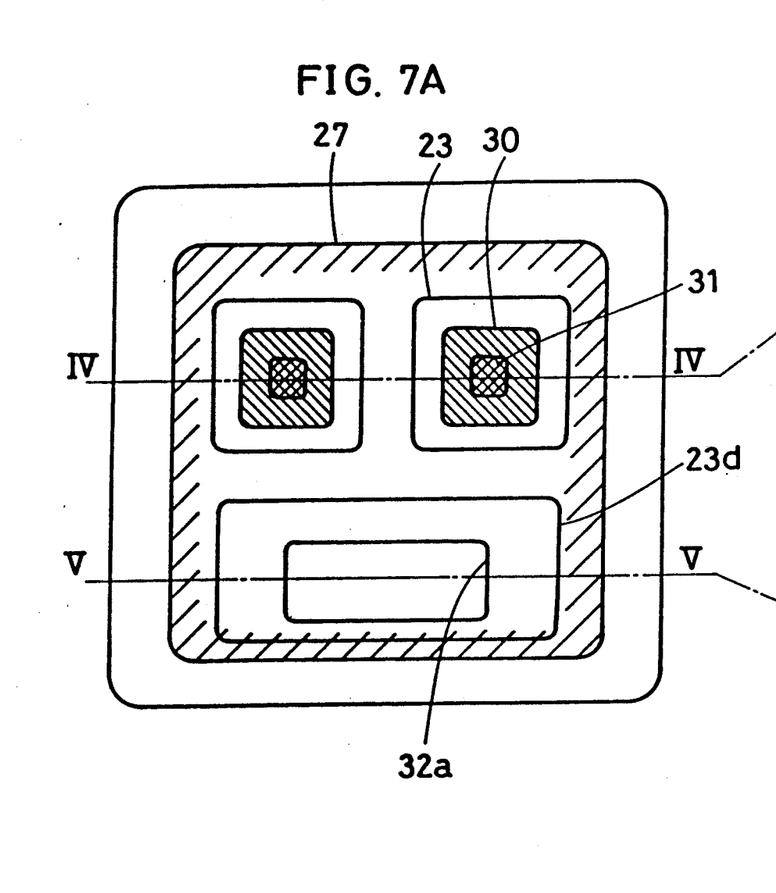
FIG. 7A is a plan view showing island cell arrangement.
Figure 7B:
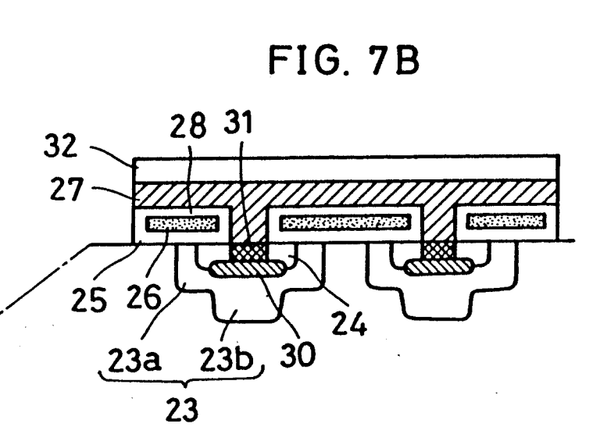
FIGS. 7B and 7C are sectional views taken along the lines IV—IV and V—V in 7A, respectively.
Figure 7C:
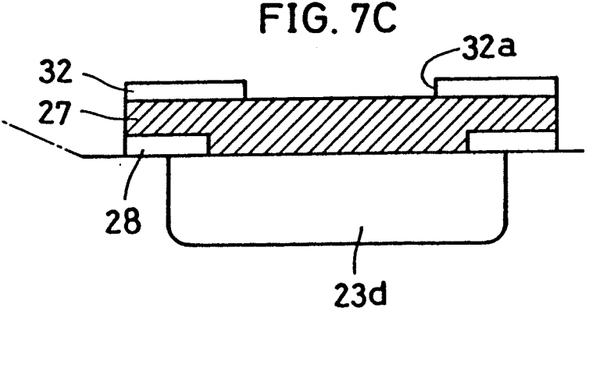

FIG. 6A and FIG. 7A are plan views schematically showing IGBT device formed by IGBT cells of the structure shown in FIG. provided in stripe arrangement and island arrangement, respectively. FIGS. 6B, 6C and 6D are sectional views taken along the lines I—I, II—II and III—III in FIG. 6A, respectively, and FIG. 7B and FIG. 7C are sectional views taken along the lines IV—IV and V—V in FIG. 7A, respectively. Each of these figures shows only two cells, for the convenience of illustration.

In each cell of the stripe arrangement shown in FIG. 6A to FIG. 6D, a conductor layer 31 is formed in the vicinity of a longitudinal end of a buried emitter electrode 30 to pass through an N+-type emitter region 24, so that the buried emitter electrode 30 is electrically connected with an emitter electrode 27 through the conductor layer 31. A surface protective film 32 is provided on the emitter electrode 27. This surface protective film 32 is provided with an opening 32a defining an emitter pad portion on a P-type well region 23c, which is continuous to a P-type well region 23.

In each cell of the island arrangement shown in FIG. 7A to FIG. 7C, a conductor layer 31 is formed in a central portion of the island to pass through an N+-type emitter region 24, so that an emitter electrode 27 and a buried emitter electrode 30 are electrically connected with each other through the conductor layer 31. A surface protective film 32 is provided on the emitter electrode 27. The surface protective film 32 is provided with an opening 32a defining an emitter pad portion on a P-type well region 23d, which is formed in the same step with a P-type well region 23.

Figure 8A:
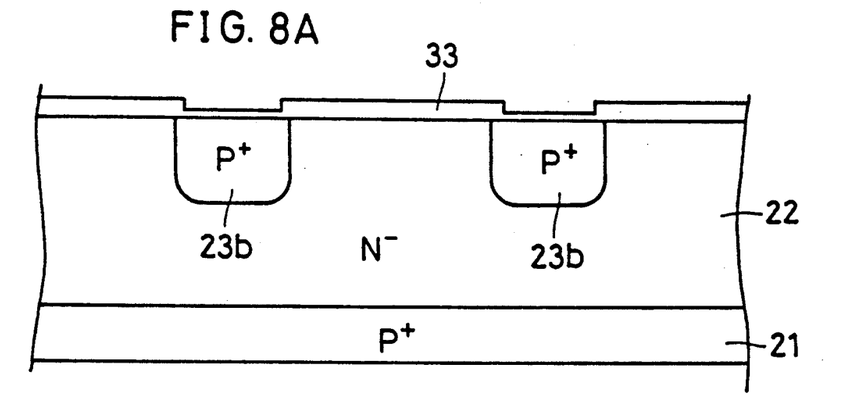
FIGS. 8A to 8E are sectional views showing steps of manufacturing the IGBT shown in FIG. 1.

FIG. 8A to FIG. 8E are sectional views showing steps of manufacturing the IGBT shown in FIG. 5. First, an N⁻-type epitaxial layer 22 of 50 to 110 μm in thickness is epitaxially grown on a first major surface of a P+-type collector layer 21, which is formed by a P+-type silicon substrate, as shown in FIG. 8A. A silicon oxide film, for example, is formed on the N⁻-type epitaxial layer 22 to be patterned, to thereby define a mask 33. A P-type impurity such as boron is selectively ion-implanted into the N⁻-type epitaxial layer 22 through the mask 33 and further diffused, to thereby form second P-type well regions 23b of about $5 \times 10^{16}$ to $1 \times 10^{19}$ cm⁻³ in surface concentration.

Figure 8B:
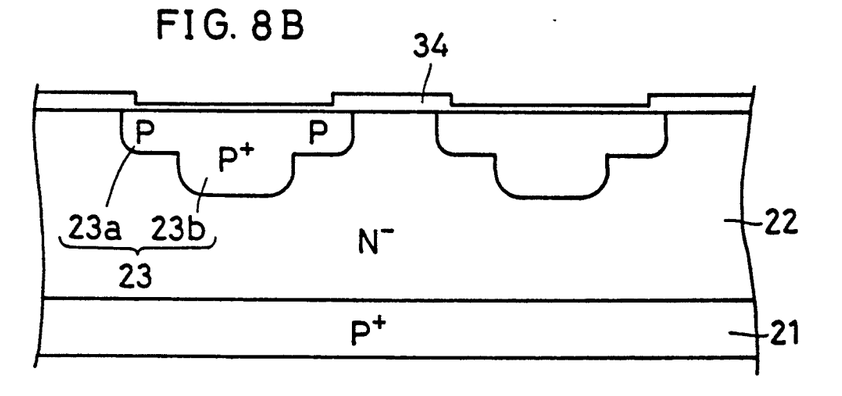

Then, the mask 33 is removed and another mask 34 is formed as shown in FIG. 8B. A P-type impurity such as boron is selectively ion-implanted into the N⁻-type epitaxial layer 22 through the mask 34 and further diffused, to thereby form first P-type well regions 23a, which are lower in concentration and smaller in depth than the second P-type well regions 23b. Thus, P-type well regions 23 are defined by the first P-type well regions 23a and the second P-type well regions 23b are provided on central portions of the first P-type well regions 23a.

Figure 8C:
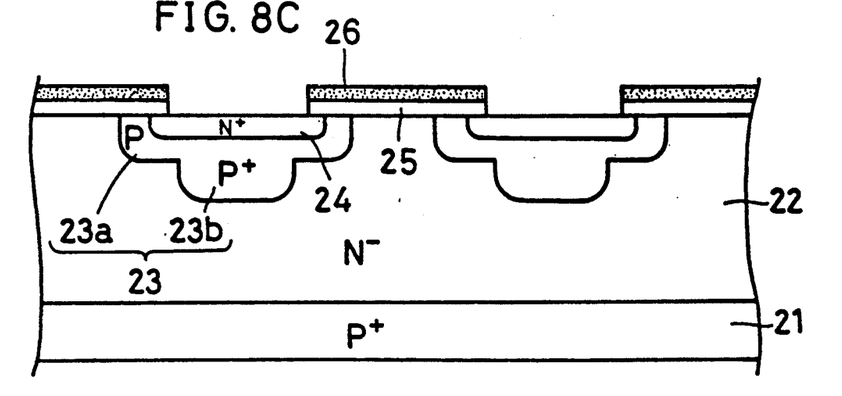

Then, as shown in FIG. 8C, the masks 34 are removed to be replaced by oxide films and polysilicon films, which are sequentially formed over the entire surface to be patterned, to thereby form gate insulating films 25 and gate electrodes 26. Thereafter an N-type impurity such as phosphorus is selectively diffused in the P-type well regions 23, to form N+-type emitter regions 24 in a self-regions alignment manner.

Figure 8D:
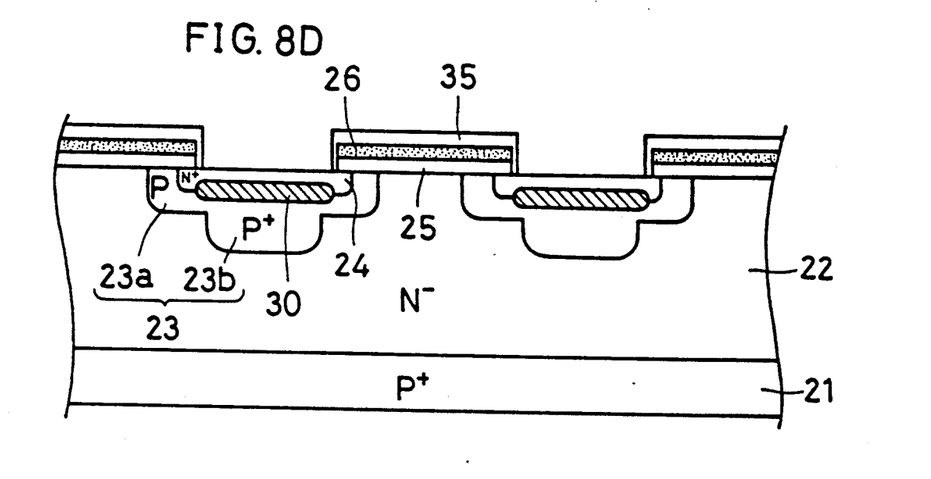

Then, masks 35 are selectively formed by silicon oxide films or the like, as shown in FIG. 8D. Ti, Co or Mo ions are injected at high energy of I to several MeV through the masks 35 and then annealing process is performed to form buried emitter electrodes 30 of Ti, Co or Mo silicide in boundaries between the N+-type emitter regions 24 and the P-type well regions 23. In general, a silicide electrode is suitably applied to a buried electrode because of excellent reproducibility of electrical properties and high adhesion to silicon.

The case of forming a buried emitter electrode 30 of Co silicide, for example, will now be described in detail. First, annealing is performed at 600° to 1000° C. under protection by masks 35. Then, Co ions accelerated to high energy are irradiated. The acceleration energy is so selected that the projection range of the Co ions substantially coincides with the boundary between an N+-type emitter region 24 and a P-type base region 23. In general, acceleration energy of about 1 MeV is required for a depth of 1 μm of the N+-type emitter region 24. An annealing temperature during irradiation is fixed in a range of 1000° to 1200° C. in order to recover turbulence in crystallinity of the N+-type emitter region 24 caused by the irradiation and to improve reproducibility. Further, annealing of about one hour is performed after the irradiation. Thus, crystallinity of the N+-type emitter region 24 can be substantially recovered to the state before irradiation. Exposure of at least $10^f$ cm⁻² is required. It is known that a CoSi₂ layer of 1100 Å in thickness is formed with exposure of $3 \times 10^{17}$ cm⁻².

Figure 8E:
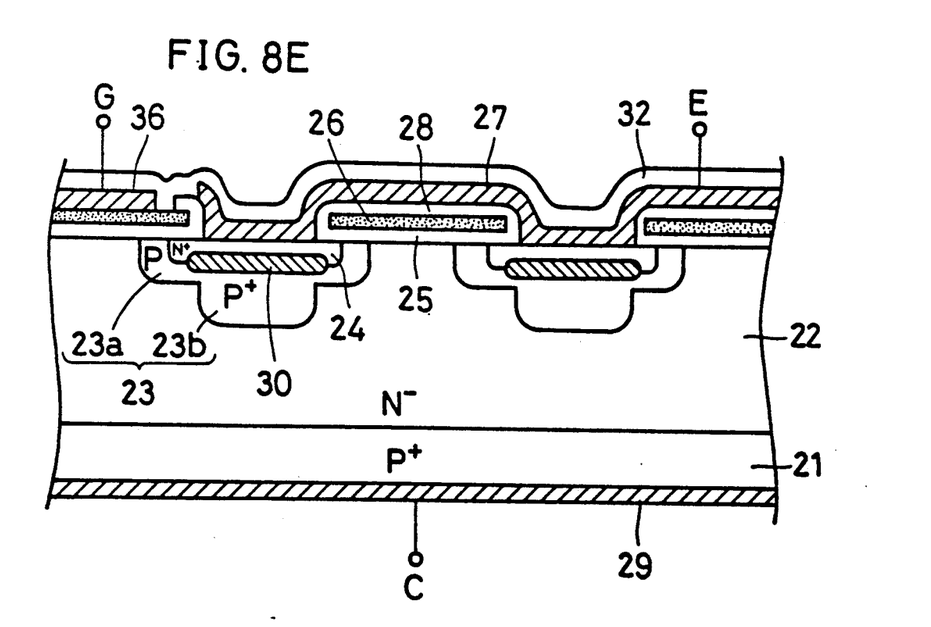

Then, as shown in FIG. 8E, the masks 35 are removed and insulating films 28 are formed over the entire surface to be patterned. Thereafter metal layers are formed over the entire surface to be patterned, to thereby form emitter electrode 27 which is electrically connected to the N+-type emitter regions 24 and gate extracting portions 36 which is electrically connected to the gate electrode 26. Contact holes are previously formed in parts of the respective cells, so that metal layers are also formed in the contact holes at this time. These metal layers serve as the conductor layers 31 shown in FIG. 6 and FIG. 7. Thus, the emitter electrode 27 and the buried emitter electrode 30 are short-circuited. Finally, a surface protective film 32 is formed over the surface except for an emitter pad area and a gate pad area and a collector electrode 29 is formed over the entire second major surface of the P+-type collector layer 21, so that an IGBT device is implemented.

In operation of such an IGBT device, electron current $I_e$ is injected from both of the emitter electrode 27 and the buried emitter electrode 30, as shown in FIG. 5. This state is substantially equivalent to increase in electrode area, whereby emitter electrode resistance is reduced.

Further, all of hole current $I_h$ flows into the buried emitter electrode 30, whereby the length of a current path for the hole current $I_h$ flowing in the P-type well region 23 is extremely reduced. Consequently, vertical resistance $R_{B1}$ and horizontal resistance $R_{B2}$ in the P-type well region 23 are reduced.

In the conventional IBGT, each N+-type emitter region 4 is divided in two with a distance L in order to short the N+-type emitter region 4 and the P+-type region 13 (P-type well region 3) by the emitter electrode 7 for preventing a latch-up phenomenon, as shown in FIG. 3. According to the IGBT of this embodiment, on the other hand, the N+-type emitter electrode 24 and the P-type well region 23 can be shorted by the buried emitter electrode 30 without dividing the N+-type emitter region 24. Consequently, the width of each IGBT cell can be reduced by the distance L as compared with the conventional case, so that integration density can be increased.

Due to the buried emitter electrode 30, further, a parasitic NPN transistor formed by the N+-type emitter region 24, the P-type base region 23 and the N−-type epitaxial layer 22 can be operate only in an area around an end of the P-type well region 23. In other words, the working area of the parasitic NPN transistor is reduced. Thus, the component of the hole current $I_h$ contributing to ON operation of the parasitic NPN transistor is decreased, so that the latch-up of the IGBT device can be effectively prevented.

Figure 9:
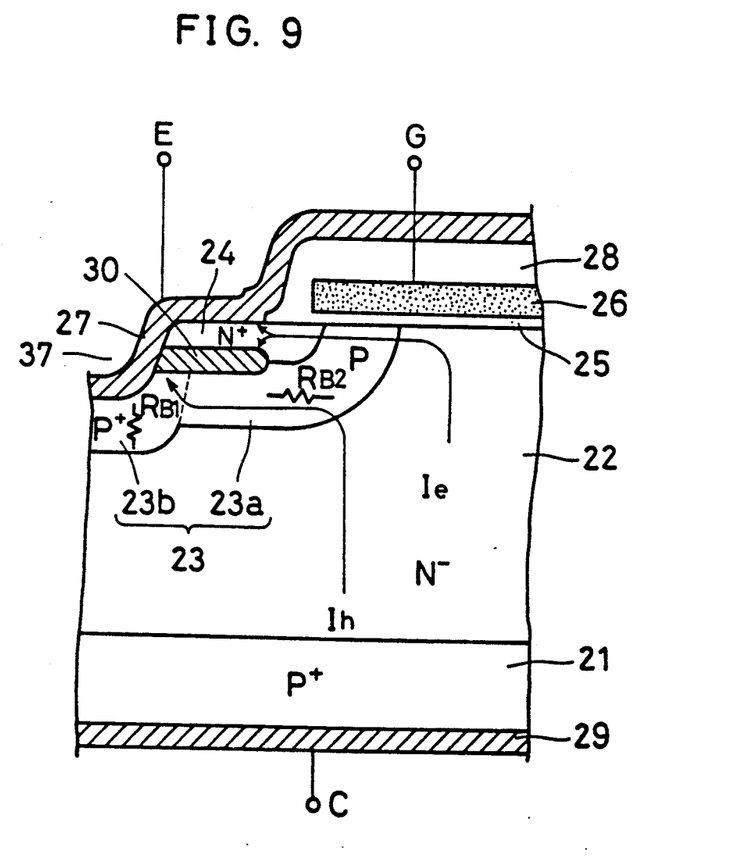
FIG. 9 is a sectional view showing another embodiment of the IGBT according to the present invention.

FIG. 9 is a sectional view showing another embodiment of the IGBT according to the present invention. In this embodiment, a first P-type well region 23a, an N+-type emitter region 24, a gate insulating film 25, a gate electrode 26 and a buried emitter electrode 30 are sequentially formed in a similar manner to the aforementioned embodiment, and then a trench 37 is formed in a central portion of the cell. A P-type impurity is diffused from the inner surface of the trench 37, to form a second P-type well region 23b with high concentration. Thereafter an emitter electrode 27 is formed over the entire surface including the inner surface of the trench 37, to short the emitter electrode 27 and the buried emitter electrode 30. According to this embodiment, a portion of the emitter electrode 27 located in the trench 37 serves as a conductor layer for shorting the emitter electrode 27 and the buried emitter electrode 30. According to the structure of this embodiment, vertical resistance $R_{B1}$ in the P-type well region 28 is further reduced, in addition to the advantages of the aforementioned embodiment.

While each of the embodiments has been described with respect to an n-channel IGBT, the present invention is also applicable to a p-channel IGBT, as a matter of course.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An insulated gate bipolar transistor comprising:
    a first conductivity type of first semiconductor layer having first and second major surfaces;
    a second conductivity type of second semiconductor layer formed on said first major surface of said first semiconductor layer;
    a first conductivity type first semiconductor region formed in a surface of said second semiconductor layer;
    a second conductivity type first semiconductor region formed in a surface of said first semiconductor region;
    an insulation film formed on the surface of said first semiconductor region between surfaces of said second semiconductor layer and said second semiconductor region;
    a control electrode formed on said insulation film;
    a first main electrode formed on said second semiconductor region;
    a second main electrode formed on said second major surface of said first semiconductor layer;
    a buried electrode formed in a boundary portion between said first and second semiconductor regions to cover almost an entire bottom of said second semiconductor region;
    a conductor layer for electrically connecting said buried electrode with said first main electrode; and
    wherein said second semiconductor region has provided at a portion thereof a contact hole in which said conductor layer is formed.

2. An insulated gate bipolar transistor in accordance with claim 1, wherein
    said buried electrode includes a silicide electrode.

3. An insulated gate bipolar transistor in accordance with claim 2, wherein
    said silicide electrode includes a $T_i$, $C_o$ or $M_o$ silicide electrode.

4. An insulated gate bipolar transistor in accordance with claim 1, wherein
    said first semiconductor region comprises a shallow well region of relatively low impurity concentration and a deep well region of relatively high impurity concentration provided in a central portion of said shallow well region.

5. An insulated gate bipolar transistor in accordance with claim 1, wherein
    said second semiconductor region has a contact hole in which said conductor layer is provided.

6. An insulated gate bipolar transistor in accordance with claim 1, wherein
    said first and second semiconductor region have a trench which penetrates said second semiconductor region to reach said first semiconductor region, said conductor layer being provided on an inner surface of said trench.

7. An insulated gate bipolar transistor in accordance with claim 6, wherein
    said first main electrode and said conductor layer include a common metal layer.

8. An insulated gate bipolar transistor device, comprising:
a first conductivity type of first semiconductor layer having first and second major surfaces; and
a plurality of insulated gate bipolar transistor cells formed on said first semiconductor layer;
each of said cells comprising:
a second conductivity type of second semiconductor layer formed on said first major surface of said first semiconductor layer;
a first conductivity type first semiconductor region formed in a surface of said second semiconductor layer;
a second conductivity type second semiconductor region formed in a surface of said first semiconductor region;
an insulation film formed on the surface of said first semiconductor region between surfaces of said second semiconductor layer and said second semiconductor region;
a control electrode formed on said insulation film;
a first main electrode formed on said second semiconductor region;
a second main electrode formed on said second major surface of said first semiconductor layer;
a buried electrode formed in a boundary portion between said first and second semiconductor regions to cover almost an entire bottom of said second semiconductor region;
a conductor layer for electrically connecting said buried electrode with said first main electrode; and
wherein said second semiconductor region has provided at a portion thereof a contact hole in which said conductor layer is formed.

9. An insulated gate bipolar transistor device in accordance with claim 8, wherein
said cells are provided in stripe arrangement.

10. An insulated gate bipolar transistor device in accordance with claim 9, wherein
said second semiconductor region has a contact hole in which said conductor layer is provided, said contact hole being provided at the end of said stripe arrangement.

11. An insulated gate bipolar transistor device in accordance with claim 8, wherein
said cells are provided in island arrangement.

12. An insulated gate bipolar transistor device in accordance with claim 11, wherein
said second semiconductor region has a contact hole in which said conductor layer is provided, said contact hole being provided at a center of said island arrangement.

13. An insulated gate bipolar transistor, comprising:
a first conductivity type of first semiconductor layer having first and second major surfaces;
a second conductivity type of second semiconductor layer formed on said first major surface of said first semiconductor layer;
a first conductivity type first semiconductor region formed in a surface of said second semiconductor layer;
a second conductivity type second semiconductor region formed in a surface of said first semiconductor region;
an insulation film formed on the surface of said first semiconductor region between surfaces of said second semiconductor layer and said second semiconductor region;
a control electrode formed on said insulation film;
a first main electrode formed on said second semiconductor region;
a second main electrode formed on said second major surface of said first semiconductor layer;
a buried electrode formed in a boundary portion between said first and second semiconductor regions to cover almost an entire bottom of said second semiconductor region;
a conductor layer for electrically connecting said buried electrode with said first main electrode; and
wherein a trench is provided to penetrate said second semiconductor region and said buried electrode to reach said first semiconductor region, said conductor layer being formed in said trench.

14. An insulated gate bipolar transistor device, comprising:
a first conductivity type of first semiconductor layer having first and second major surfaces; and
a plurality of insulated gate bipolar transistor cells formed on said first semiconductor layer;
each of said cells comprising:
a second conductivity type of second semiconductor layer formed on said first major surface of said first semiconductor layer;
a first conductivity type first semiconductor region formed in a surface of said second semiconductor layer;
a second conductivity type second semiconductor region formed in a surface of said first semiconductor region;
an insulation film formed on the surface of said first semiconductor region between surfaces of said second semiconductor layer and said second semiconductor region;
a control electrode formed on said insulation film;
a first main electrode formed on said second semiconductor region;
a second main electrode formed on said second major surface of said first semiconductor layer;
a buried electrode formed in a boundary portion between said first and second semiconductor regions to cover almost an entire bottom of said second semiconductor region;
a conductor layer for electrically connecting said buried electrode with said first main electrode; and
wherein a trench is provided to penetrate said second semiconductor region and said buried electrode to reach said first semiconductor region, said conductor layer being formed in said trench.

* * * * *